United States Patent
Lee et al.

(10) Patent No.: US 9,122,089 B2
(45) Date of Patent: Sep. 1, 2015

(54) DISPLAY DEVICE

(75) Inventors: Yui-Ku Lee, Chungcheongnam-do (KR); Chul Huh, Gyeonggi-do (KR); Jin-Seuk Kim, Daejeon (KR); Min Kang, Seoul (KR); Dong-Uk Kang, Gyeonggi-do (KR); Sun-Young Chang, Gyeonggi-do (KR)

(73) Assignee: Samsung Display Co., Ltd. (KR)

( * ) Notice: Subject to any disclaimer, the term of this patent is extended or adjusted under 35 U.S.C. 154(b) by 160 days.

(21) Appl. No.: 12/917,305

(22) Filed: Nov. 1, 2010

(65) Prior Publication Data

US 2011/0304804 A1    Dec. 15, 2011

(30) Foreign Application Priority Data

Jun. 10, 2010    (KR) .................. 10-2010-0054999

(51) Int. Cl.
*G02F 1/1335* (2006.01)
*C09K 11/06* (2006.01)
*H01L 51/00* (2006.01)

(52) U.S. Cl.
CPC .......... *G02F 1/133514* (2013.01); *C09K 11/06* (2013.01); *C09K 2211/1029* (2013.01); *C09K 2211/188* (2013.01); *G02F 1/133603* (2013.01); *G02F 2001/133614* (2013.01); *H01L 51/0081* (2013.01); *H01L 51/0082* (2013.01); *Y02B 20/181* (2013.01)

(58) Field of Classification Search
None
See application file for complete search history.

(56) References Cited

U.S. PATENT DOCUMENTS

| | | | |
|---|---|---|---|
| 6,100,312 A * | 8/2000 | Suzuki et al. | 522/6 |
| 6,600,175 B1 * | 7/2003 | Baretz et al. | 257/100 |
| 2003/0187106 A1 * | 10/2003 | Moretti et al. | 524/90 |
| 2004/0237842 A1 * | 12/2004 | Hall-Goulle et al. | 106/413 |
| 2009/0219225 A1 * | 9/2009 | Cope | 345/55 |

FOREIGN PATENT DOCUMENTS

| | | |
|---|---|---|
| JP | 10-142796 | 5/1998 |
| JP | 2001-097975 | 4/2001 |
| JP | 2004-327492 | 11/2004 |
| JP | 2005-506434 | 3/2005 |
| JP | 2006-106595 A | 4/2006 |
| JP | 2008-040404 A | 2/2008 |
| JP | 2009-229791 | 10/2009 |
| KR | 1020020002319 A | 1/2002 |
| KR | 1020070042719 A | 4/2007 |

* cited by examiner

*Primary Examiner* — J. L. Yang
(74) *Attorney, Agent, or Firm* — Innovation Counsel LLP

(57) ABSTRACT

A display device includes a light emitting unit and a display panel including a first color filter. The light emitting unit includes a light source generating a blue light, and a light-converting part converting the blue light into a white light and emitting the white light to an exterior. The first color filter, through which the white light passes, includes a first coloring agent that absorbs about 95% to about 100% of light having wavelength of about 420 nm to about 470 nm in the white light. Thus, a color reproducibility of the display device may be improved.

9 Claims, 4 Drawing Sheets

DISPLAY DEVICE

This application claims priority to Korean Patent Applications No. 2010-0054999, filed on Jun. 10, 2010, and all the benefits accruing therefrom under 35 U.S.C. §119, the contents of which are herein incorporated by reference in their entirety.

BACKGROUND OF THE INVENTION

1. Field of the Invention

Example embodiments of the present invention relate to a display device. More particularly, example embodiments of the present invention relate to a display device employing a light emitting diode (LED).

2. Description of the Related Art

In general, a liquid crystal display (LCD) device includes a display panel and a light providing assembly. An image is displayed on the LCD device when light from the light providing assembly shines through the display panel. The display panel includes a first substrate including a switching device driving a pixel, and a second substrate facing the first substrate. A liquid crystal layer is interposed between the first and second substrates. The second substrate typically includes a color filter to display a color image.

The light providing assembly includes a light emitting unit that generates light, and optical members to effectively transfer the light generated by the light emitting unit to the display panel. A conventional light emitting unit includes a light source such as a cold cathode fluorescent lamp (CCFL), an external electrode fluorescent lamp (EEFL), etc. Recently, light emitting diodes (LED) having a high brightness have become widely used as the light source.

White light generated by the light providing assembly passes through the color filter after passing through the liquid crystal layer. The light that has passed through the color filter mixes colors to display a color image. The display device may include, for example, a red color filter, a green color filter and a blue color filter. The color filters include a dye and/or a pigment as a coloring agent and that control the color reproducibility of the display device.

However, the color reproducibility of the display device may be affected by a light source spectrum, which varies according to the type of light source used in the light providing assembly, as well as the coloring agent used in the color filters. Thus, when the type of light source used in the light providing assembly is changed, the light source spectrum is also changed, which can result in deterioration of the color reproducibility of the display device. Therefore, when a color filter that has been used with a conventional light providing assembly using a CCFL as a light source is used with a light providing assembly using an LED as a light source, the color reproducibility of the display device may be deteriorated.

BRIEF SUMMARY OF THE INVENTION

A display device is provided that is capable of optimizing color reproducibility when the display device includes a light emitting diode that generates a blue light as a light source.

A display device includes a light emitting unit and a display panel that includes a first color filter. The light emitting unit includes a light source that generates a blue light, and a light-converting part that converts the blue light into a white light and emits the white light to an exterior of the light emitting unit. The first color filter, through which the white light passes, includes a first coloring agent that absorbs about 95% to about 100% of light having wavelengths of about 420 nm to about 470 nm in the white light.

The first coloring agent may include a compound represented by the following Chemical Formula 1, wherein $R_1$, $R_2$, $R_3$ and $R_4$ independently represent a hydrogen atom, a hydroxyl group, an alkyl group having 1 to 30 carbon atoms, an alkenyl group having 2 to 30 carbon atoms, an oxyalkyl group having 1 to 30 carbon atoms, a cycloalkyl group having 3 to 30 carbon atoms of, an aryl group having 6 to 30 carbon atoms, or a derivative or a polymer thereof, and M represents chromium (Cr), aluminum (Al), gallium (Ga) or indium (In).

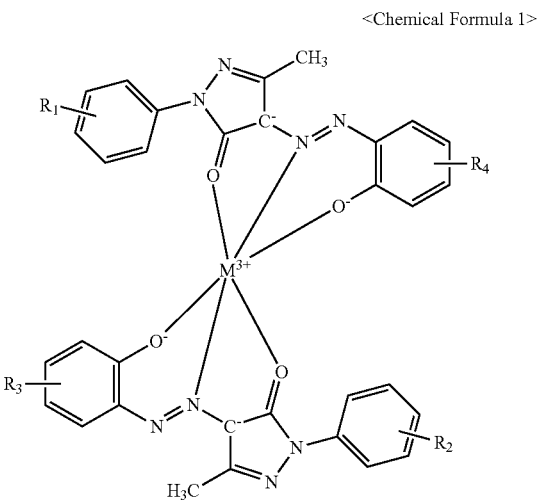

<Chemical Formula 1>

The first coloring agent may include a compound represented by the following Chemical Formula 1, and the second coloring agent may include a compound represented by the following Chemical Formula 2, wherein $R_5$ and $R_6$ independently represent a hydrogen atom, a hydroxyl group, an alkyl group having 1 to 30 carbon atoms, an alkenyl group having 2 to 30 carbon atoms, an oxyalkyl group having 1 to 30 carbon atoms, a cycloalkyl group having 3 to 30 carbon atoms, an aryl group having 6 to 30 carbon atoms, or a derivative or a polymer thereof.

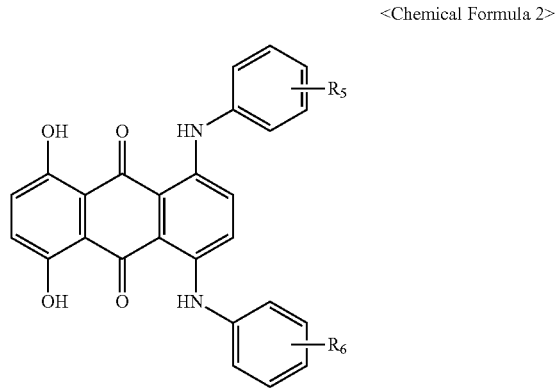

<Chemical Formula 2>

The light source includes gallium nitride (GaN) and indium gallium nitride (InGaN), and the light-converting part includes a fluorescent material.

A display device is provided that includes a light emitting unit and a display panel including a color filter. The light emitting unit includes a light source generating a blue light, and a light-converting part. A display device includes a light emitting unit and a display panel including a color filter. The light emitting unit includes a light source generating a blue light, and a light-converting part converting the blue light into a white light and emitting the white light to an exterior of the light emitting unit. The first color filter, through which the white light passes, includes a coloring agent that absorbs light having wavelengths of about 420 nm to about 470 nm in the white light, and the coloring agent may be represented by the Chemical Formula 1.

In another aspect, a display device includes a light emitting unit and a display panel including a color filter. The light emitting unit includes a light source generating a blue light, and a light-converting part converting the blue light into a white light and emitting the white light to an exterior of the light emitting unit. The first color filter, through which the white light passes, includes a coloring agent that absorbs light having wavelengths of about 420 nm to about 470 nm in the white light, and the coloring agent may be represented by the Chemical Formula 2.

In another aspect, a red color filter or a green color filter may include a coloring agent that absorbs light having wavelengths of about 420 nm to about 470 nm. Thus, deterioration of color reproducibility of a display device, which includes a light emitting unit converting a blue light generated by a light source into a white light and emitting the white light to an exterior of the light emitting unit, may be prevented. When a display device includes a cold cathode fluorescent lamp (CCFL) as a light source, light generated by the CCFL does not include much light having wavelengths of about 420 nm to about 470 nm. Therefore, color mixture is not a significant problem when the light generated by such a light source passes through a red color filter or a green color filter. The white light emitted by the light emitting unit including a blue light emitting diode, however, includes light having wavelengths of about 420 nm to about 470 nm. Thus, a significant color mixture problem may result. However, the display device provided herein includes a coloring agent that absorbs light having wavelengths of about 420 nm to about 470 nm, thereby optimizing color reproducibility of a red color filter and a green color filter, preventing the color mixture problems, and maintaining a brightness substantially equal to a display device that does not include the coloring agent.

BRIEF DESCRIPTION OF THE DRAWINGS

The above and other features and advantages will become more apparent by describing in detailed exemplary embodiments thereof with reference to the accompanying drawings, in which.

DETAILED DESCRIPTION OF THE INVENTION

Figure 1A:
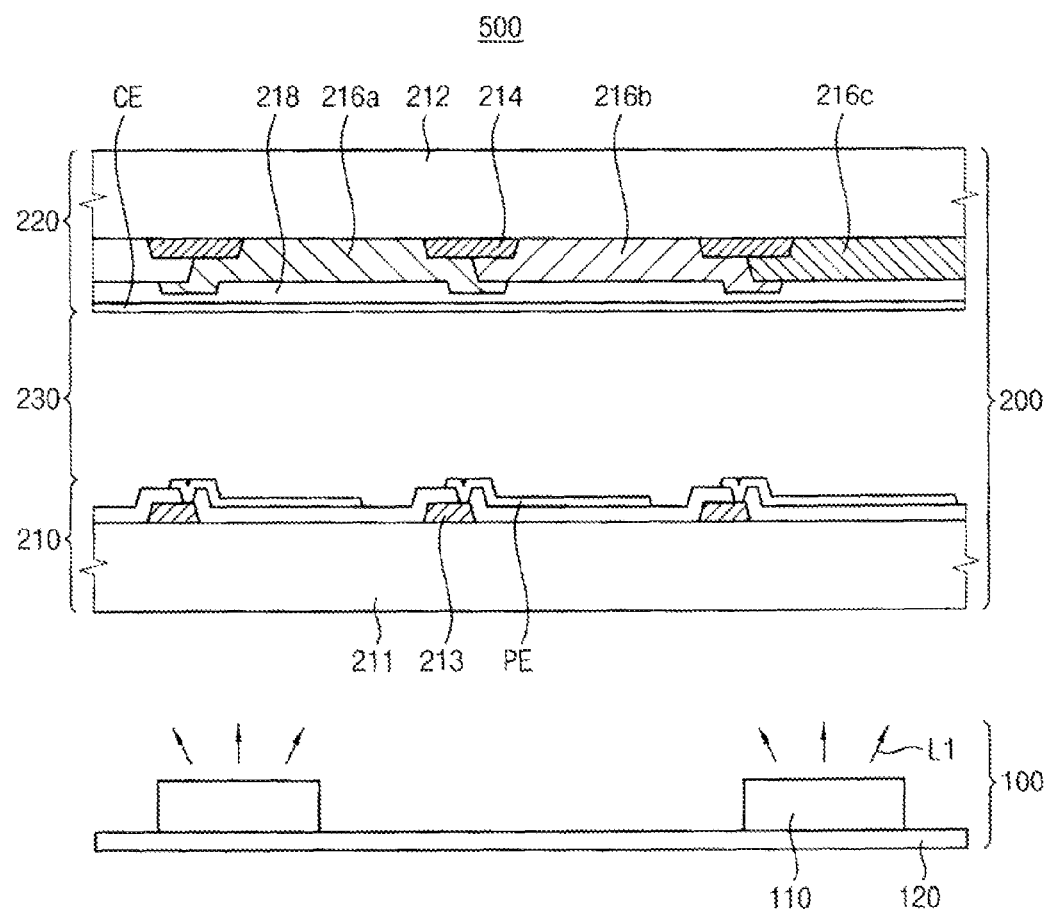
FIG. 1A is a cross-sectional view illustrating a display device according to an example embodiment.

FIG. 1A is a cross-sectional view illustrating a display device according to an example embodiment.

Referring to FIG. 1A, a first display device 500 includes a first light providing assembly 100 and a first display panel 200.

The first light providing assembly 100 includes a light source unit 110 that generates light. The light source unit 110 is mounted on a circuit board 120 that provides a light source driving signal to the light source unit 110. The light source unit 110 provides a white light L1 to the first display panel 200. The light source unit 110 will be more fully explained below with reference to FIG. 1B.

The first light providing assembly 100 may further include conventional optical sheets and/or optical plates (not shown) disposed between the light source unit 110 and the first display panel 200. The optical sheets and/or optical plates diffuse and condense the light generated by the light source unit 110 to effectively direct uniform light toward the first display panel 200.

The first display panel 200 includes a first substrate 210, a second substrate 220 and a liquid crystal layer 230. The first display panel 200 uses the white light L1 provided by the first light providing assembly 100 to display an image. The second substrate 220 faces the first substrate 210, and the liquid crystal layer 230 is interposed between the first and second substrates 210 and 220.

The first substrate 210 includes a switching element 213 and a pixel electrode PE electrically connected to the switching element 213. The switching element 213 is formed on a first base substrate 211, and controls turning on and off of each of the pixels. The switching element 210 includes a control electrode (not shown) electrically connected to signal lines (not shown) of the first substrate 210, an input electrode (not shown) and an output electrode (not shown). The output electrode is electrically connected to the pixel electrode PE.

The second substrate 220 includes a light blocking pattern 214, color filters 216a, 216b and 216c, an overcoating layer 218 and a common electrode CE, which are formed on a second base substrate 212 that faces the first base substrate 211. The light blocking pattern 214 may be formed in a position on the second base substrate 212 that corresponds to the position of the switching element 213 and the signal lines of the first substrate 210. The color filters 216a, 216b and 216c may be formed on a region of the second substrate 220 that faces the pixel electrode PE. The color filters 216a, 216b and 216c include a first color filter 216a representing a red color, a second color filter 216b representing a green color and a third color filter 216c representing a blue color. A thickness of each of the color filters 216a, 216b and 216c may be about 1.5 μm to about 2.7 μm. In an example embodiment, the overcoating layer 218 may be omitted so that the common electrode CE may be formed directly on the second base substrate 212 that has the color filters 216a, 216b and 216c.

The first color filter 216a includes a first coloring agent that absorbs light having wavelengths of about 420 nm to about 470 nm from the white light L1. The first coloring agent may include a dye and/or a pigment.

The first color filter 216a has a maximum light transmittance in a first wavelength range of about 580 nm to about 750 nm. The first coloring agent has a maximum light transmittance in the first wavelength range, and absorbs light having wavelengths of about 420 nm to about 470 nm so that light having wavelengths of about 420 nm to about 470 nm may not pass through the first color filter 216a. An absorption ratio of the first coloring agent to light having wavelengths of about 420 nm to about 470 nm may be about 95% to about 100%, and may be preferably about 97% to about 100%. The absorption ratio is defined by subtracting an transmission ratio from 100%, where the transmission ratio is represented by X/Y and measured by a spectrometer , where X is a transmission spectrum of an object, and Y is a transmission spectrum of a reference glass. For example, the first coloring agent may include a compound represented by the following Chemical Formula 1.

<Chemical Formula 1>

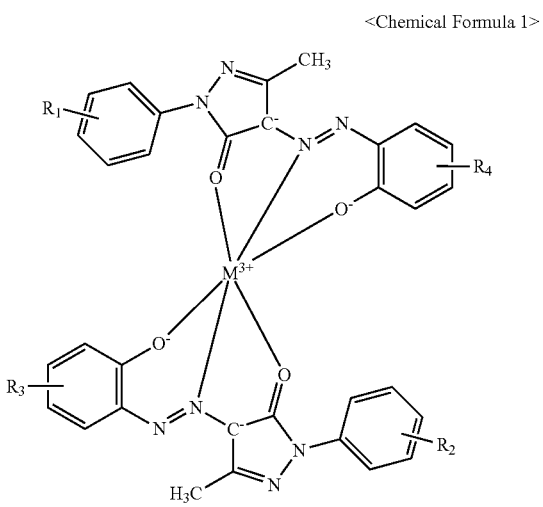

In Chemical Formula 1, $R_1$, $R_2$, $R_3$ and $R_4$ independently represent a hydrogen atom, a hydroxyl group, an alkyl group having 1 to 30 carbon atoms, an alkenyl group having 2 to 30 carbon atoms, an oxyalkyl group having 1 to 30 carbon atoms, a cycloalkyl group having 3 to 30 carbon atoms, an aryl group having 6 to 30 carbon atoms, or a derivative or a polymer thereof, and M represents chromium (Cr), aluminum (Al), gallium (Ga) or indium (In).

The second color filter 216b includes a second coloring agent that absorbs about 95% to about 100% of light having wavelengths of about 420 nm to about 470 nm from the white light L1. Preferably, an absorption ratio of the second coloring agent of the light having wavelengths of about 420 nm to about 470 nm may be 97% to about 100%. The second coloring agent may include a dye and/or a pigment. The second color filter 216b has a maximum light transmittance in a second wavelength range of about 500 nm to about 550 nm. The second coloring agent has a maximum light transmittance in the second wavelength range, and absorbs light having wavelengths of about 420 nm to about 470 nm, so that the light having wavelengths of about 420 nm to about 470 nm may not pass through the second color filter 216b. For example, the second coloring agent may include a compound represented by the following Chemical Formula 2.

<Chemical Formula 2>

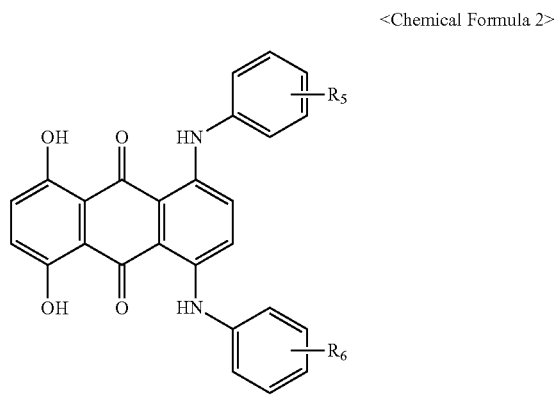

In Chemical Formula 2, $R_5$ and $R_6$ independently represent a hydrogen atom, a hydroxyl group, an alkyl group having 1 to 30 carbon atoms, an alkenyl group having 2 to 30 carbon atoms, an oxyalkyl group having 1 to 30 carbon atoms, a cycloalkyl group having 3 to 30 carbon atoms, an aryl group having 6 to 30 carbon atoms, or a derivative or a polymer thereof.

Returning to the first color filter 216a, the first color filter 216a may further include a photosensitive composition and a third coloring agent in addition to the first coloring agent. The photosensitive composition may be cured in response to an external light in the process of forming the first and second color filters 216a and 216b. The photosensitive composition may include an initiator, a monomer, a binder, and etc. The initiator generates a radical in response to the external light. The monomer is polymerized by the radical. The binder protects the monomer of the photosensitive composition dissolved in a solvent. The third coloring agent may include a dye and/or a pigment.

Examples of the initiator may include a conventional initiator generally used for a photosensitive composition. Particularly, examples of the initiator may include an acetophenone compound, a benzophenone compound, a thioxanthone compound, a benzoin compound, a triazine compound, an oxime compound, etc. These may be used each alone or in a combination thereof. Examples of the acetophenone compound may include 2,2'-diethoxyacetophenone, 2,2'-dibutoxyacetophenone, 2-hydroxy-2-methylfluorophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropane-1-on, 2-benzyl-2-dimethylamino-1-(4-morpholinophenyl)-butane-1-on, and the like. Examples of the benzophenone compound may include benzophenone, benzoic acid, methyl benzoic acid, 4-phenylbenzophenone, hydroxybenzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like. Examples of the thioxanthone compound may include thioxanthone, 2-methylthioxanthone, isopropylthioxanthone, 2,4-diethylthioxanthone, 2,4-diisopropylthioxanthone, 2-chlorothioxanthone, and the like.

Examples of the benzoin compound may include benzoin, benzoin methylether, benzoin ethylether, benzoin isopropylether, benzoin isobutylether, benzyldimethylketal, and the like. Examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho-1-il)-4,6-bis(trichloromethyl)-s-triazine, 2-(4-methoxynaphto-1-il)-4,6-bis(trichloromethyl)-s-triazine, 2-4-trichloromethyl(piperonyl)-6-triazine, 2-4-trichloromethyl(4'-methoxystyryl)-6-triazine, 2-piperonyl-4,6-bis(trichloromethyl)-1,3,5-triazine, and the like. Examples of the oxime compound may include 2-(o-benzoiloxime)-1-[4-(phenylthio)phenyl]-1,2-octanedione, 1-(o-acetyloxime)-1-[9-ethyl-6-(2-methylbenzoil)-9H-carbazole-3-il]ethanone, and the like.

Examples of the initiator may also include a carbazole compound, diketone compound, a sulphonium borate compound, a diazo compound, a biimidazole compound, etc.

The monomer may include a multifunctional monomer comprising at least two hydroxyl groups. Examples of the monomer may include glycerol(meth)acrylate, pentaerythritol di(meth)acrylate, ethyleneglycol di(meth)acrylate, triethyleneglycol di(meth)acrylate, 1,4-butandiol di(meth)acrylate, 1,6-hexanediol di(meth)acrylate, neopentylglycol di(meth)acrylate, pentaerythritol tri(meth)acrylate, dipentaerythritol tri(meth)acrylate, dipentaerythritol (meth)acrylate, bisphenol A di(meth)acrylate, trimethylolpropane tri(meth)acrylate, novolak epoxy(meth)acrylate, dietyleneglycoldi(meth)acrylate, propyleneglycol (meth)acrylate, and the like.

Examples of the binder may include (meth)acrylic acid, alkyl(meth)acrylate, aryl(meth)acrylate, alcohol(meth)acrylate, alkylaryl(meth)acrylate, succinic(meth)acrylate, (meth)acrylate copolymer resin formed from a styrene monomer, and the like. These may be used each alone or in a combination thereof.

The photosensitive composition including the initiator, the monomer and the binder is dissolved in a solvent to be used to form a color filter composition. When the color filter composition is exposed to light and developed, the solvent is mostly removed to form the first color filter 216a. Examples of the solvent may include conventional solvents generally used for a color filter composition, and these may be used each alone or in a combination thereof.

The color filter composition may further include an additive to prevent bruising and generating spots, to control leveling, or to prevent residues due to a non-exposure. Examples of the additive may include malonic acid, 3-amino-1,2-propanediol, a silane coupling agent having a vinyl group or a (meth)acryl oxime group, a fluorine-based surfactant, an epoxy resin, etc. These may be used each alone or in a combination thereof.

As mentioned above, the first color filter 216a may further include a third coloring agent. The third coloring agent of the first color filter 216a may include compounds represented by the following Chemical Formulas 3 to 5. These may be used each alone or in a combination thereof.

<Chemical Formula 3>

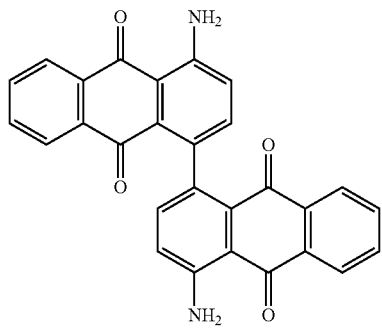

<Chemical Formula 4>

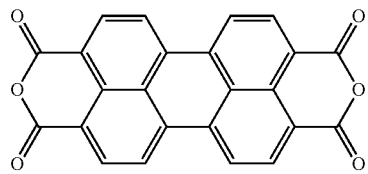

<Chemical Formula 5>

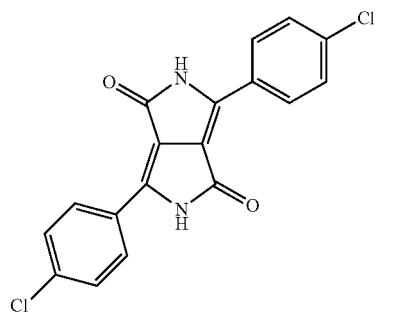

The first color filter 216a may further include a fourth coloring agent including at least one of compounds represented by the following Chemical Formulas 6 to 11. These may be used each alone or in a combination thereof. The compounds of Chemical Formulas 6 to 10 may transmit light having wavelengths corresponding to yellow color, for example, which are more than about 480 nm. The compound of Chemical Formula 11 may transmit light having a wavelength corresponding to blue color and red color, and may absorb light having wavelengths corresponding to green color, which are in a range of about 500 nm to about 650 nm, thereby showing a violet color.

<Chemical Formula 6>

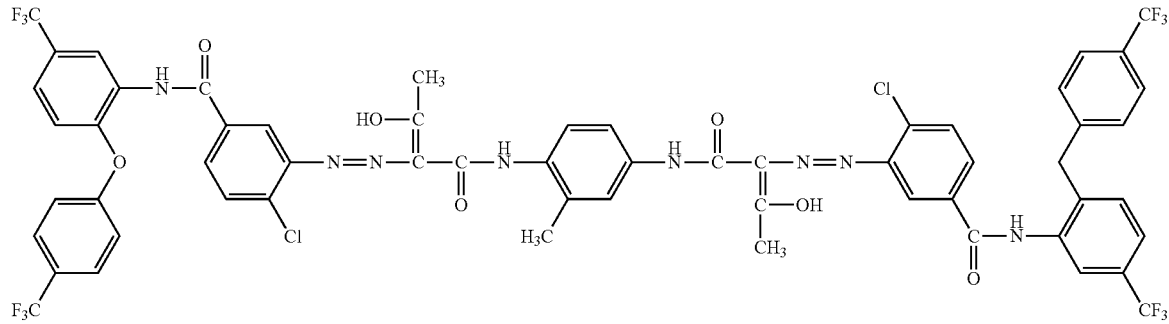

<Chemical Formula 7>

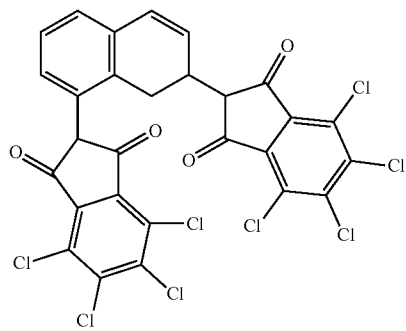

<Chemical Formula 8>

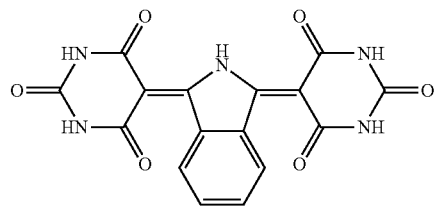

<Chemical Formula 9>

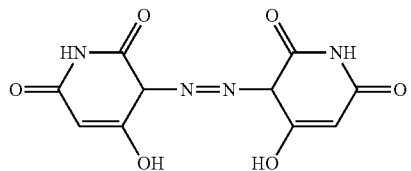

<Chemical Formula 10>

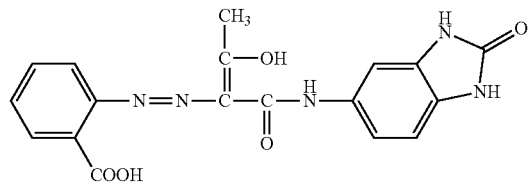

<Chemical Formula 11>

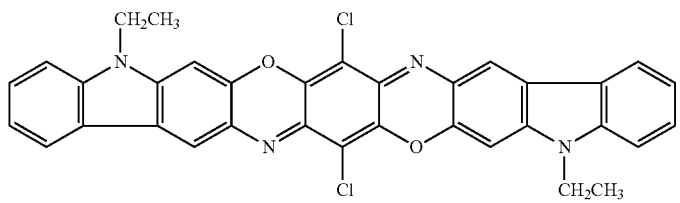

In an embodiment, the first color filter 216a includes the first coloring agent represented by Chemical Formula 1, the third coloring agent represented by Chemical Formula 5, and the fourth coloring agent represented by Chemical Formula 9. In the Chemical formula 1, M represents aluminum, and $R_1$, $R_2$, $R_3$ and $R_4$ independently represent an ethyl group.

Returning to the second color filter 216b, the second color filter 216b may further include a photosensitive composition and a fifth coloring agent in addition to the second coloring agent. The photosensitive composition for the second color filter 216b is substantially the same as the photosensitive composition described above for the first color filter 216a. Thus, further explanation will be omitted. The fifth coloring agent may include compounds represented by the following Chemical Formulas 12 to 14.

<Chemical Formula 12>

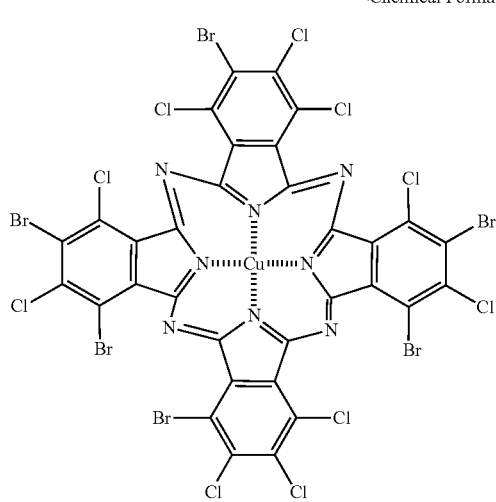

<Chemical Formula 13>

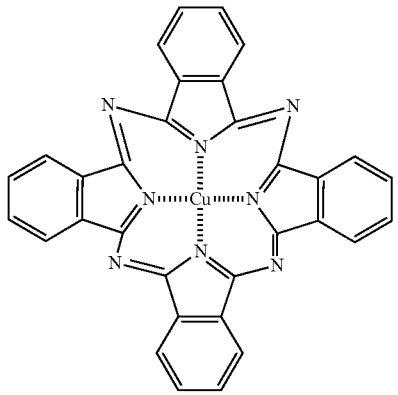

<Chemical Formula 14>

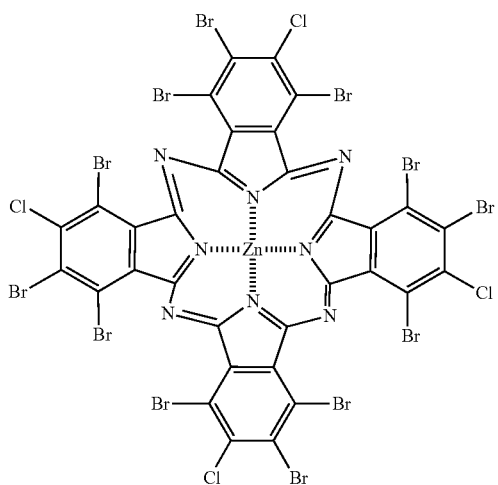

The second color filter 216b may further include the fourth coloring agent including at least one of the compounds represented by Chemical Formulas 6 to 11. These may be used each alone or in a combination thereof.

In an embodiment, the second color filter 216b includes the second coloring agent represented by Chemical Formula 2 and the fourth coloring agent represented by Chemical Formula 9.

The third color filter 216c includes the photosensitive composition and a sixth coloring agent that is different from the coloring agents used for the first and second color filters 216a and 216b. The third color filter 216c may further include the fourth coloring agent including at least one of the compounds represented by Chemical Formulas 6 to 11. These may be used each alone or in a combination thereof.

Figure 1B:
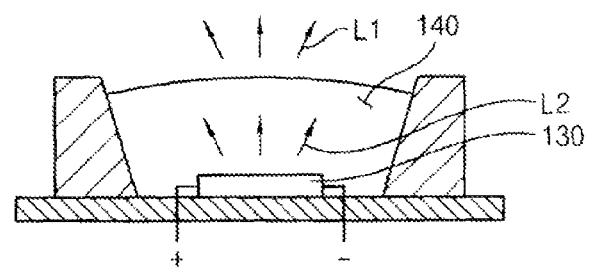
FIG. 1B is a cross-sectional view illustrating the light source unit of FIG. 1A.

FIG. 1B is a cross-sectional view illustrating the light source unit 110 of FIG. 1A.

Referring to FIG. 1B, the light source unit 110 includes a light source 130 generating a light and a light-converting part 140 covering the light source 130. The light source 130 substantially emits a blue light L2, and the blue light L2 passes through the light-converting part 140 to be converted into the white light L1, and the white light L1 exits the light source unit 110.

The light source 130 generates the blue light L2. The blue light L2 has wavelengths of about 400 nm to about 500 nm. The light source 130 may include, for example, gallium nitride (GaN), or indium gallium nitride (InGaN), and the like.

The light-converting part 140 may include a fluorescent material. The fluorescent material absorbs the blue light L2 generated by the light source 130, and emits light. The fluorescent material may include a compound absorbing the blue light L2 and emitting a red light, and a compound absorbing the blue light L2 and emitting a green light. The red light and the green light are mixed with the blue light L2 passing through the light-converting part 140 to be perceived as the white light L1 by an observer. Examples of the fluorescent material may include cerium (Ce) doped yttrium aluminate ganet ($Y_3Al_5O_{12}$:Ce), nitride, silicate and the like.

When a red color filter or a green color filter does not include the first coloring agent or the second coloring agent, light having wavelengths of about 420 nm to about 470 nm from the white light L1 pass through the red color filter and the green color filter, thereby deteriorating color reproducibility. In contrast, the first color filter 216a that includes the first coloring agent, and the second color filter 216b that includes the second coloring agent, absorb light having a wavelength of about 420 nm to about 470 nm from the white light L1. Thus, deterioration of color reproducibility may be minimized According to an example embodiment, the first coloring agent is added to the first color filter 216a, or is substituted for a conventional coloring agent which would be used in a conventional color filter, thereby preventing a portion of the blue light L2 generated by the light source 130 from passing through the first color filter 216a. Therefore, color reproducibility of the first color filter 216a may be improved. Furthermore, the second coloring agent is added to the second color filter 216b, or is substituted for a conventional coloring agent, thereby preventing a portion of the blue light L2 generated by the light source 130 from passing through the second color filter 216b. Therefore, color reproducibility of the second color filter 216b may be improved.

Figure 2:
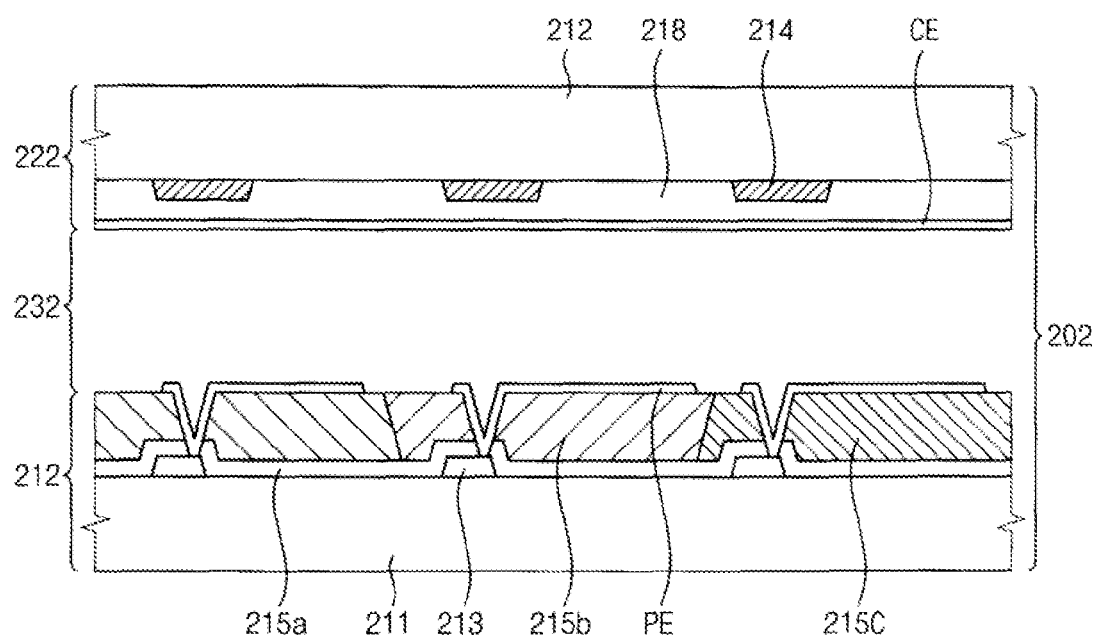
FIG. 2 is a cross-sectional view illustrating a display device according to another example embodiment.
Figure 2:
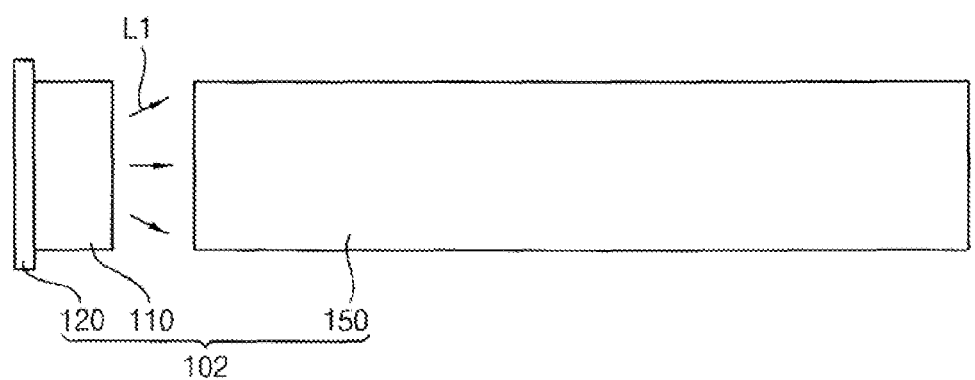

FIG. 2 is a cross-sectional view illustrating a display device according to another example embodiment.

Referring to FIG. 2, a second display device 502 includes a second light providing assembly 102 and a second display panel 202.

The second light providing assembly 102 includes a light source unit 110 mounted on a printed circuit board 120 which are substantially the same as those described above for the first light providing assembly 100 illustrated in FIGS. 1A and 1B. Thus further description of the light source unit 110 and printed circuit board 120 will be omitted. The second light providing assembly is substantially the same as the first light providing assembly 100 illustrated in FIGS. 1A and 1B, except that the second light providing assembly 102 is an edge type assembly and includes a light guide plate 150.

A light source unit 110 of the second light providing assembly 102 is disposed on a region corresponding to an edge of the second display panel 202. The light generated by the light source unit 110 is provided to the second display panel 202 by the light guide plate 150, which faces the second display panel 202.

The second display panel 202 includes a first substrate 212, a second substrate 222 and a liquid crystal layer 232. The second display panel 202 uses the white light L1 provided by the second light providing assembly 102 to display an image. The second substrate 222 faces the first substrate 212, and the liquid crystal layer 232 is interposed between the first and second substrates 212 and 222.

The first substrate 212 includes a switching element 213, a first color filter 215a, a second color filter 215b, a third color filter 125c and a pixel electrode PE electrically connected to the switching element 213. The switching element 213 is substantially the same as the switching element 213 illustrated in FIG. 1.

The first color filter 215a includes a first coloring agent absorbing light having wavelengths of about 420 nm to about 470 nm from the white light L1. The second color filter 215b includes a second coloring agent absorbing light having wavelengths of about 420 nm to about 470 nm in the white light L1. The first to third color filters 215a, 215b and 215c are substantially the same as the first to third color filters 216a, 216b and 216c except that the first to third color filters 215a, 215b and 215c are formed on the first base substrate 211. Thus, further explanation will be omitted. The pixel electrode PE may be formed on the first to third color filters 215a, 215b and 215c. A thickness of each of the first to third color filters 215a, 215b and 215c may be about 2.7 μm to about 3.5 μm.

The second substrate 222 includes a common electrode CE formed on a second base substrate 212 that faces the first base substrate 211. The second substrate 222 may further include a light blocking pattern 214 and/or an overcoating layer 218, which are formed between the second base substrate 212 and the common electrode CE. In an embodiment, the light blocking pattern 214 may be formed on the first substrate 212 or omitted. In another embodiment, the overcoating layer 218 may be omitted so that the common electrode CE is formed directly on the second base substrate 212 having the light blocking pattern 214.

The second display panel 202 may also be combined with the first light providing assembly 100 illustrated in FIG. 1 instead of the second light providing assembly 102 to form a display device. Additionally, the second light providing assembly 102 may be combined with the first display panel 200 illustrated in FIG. 1 instead of the second display panel 202 to form a display device.

Figure 3A:
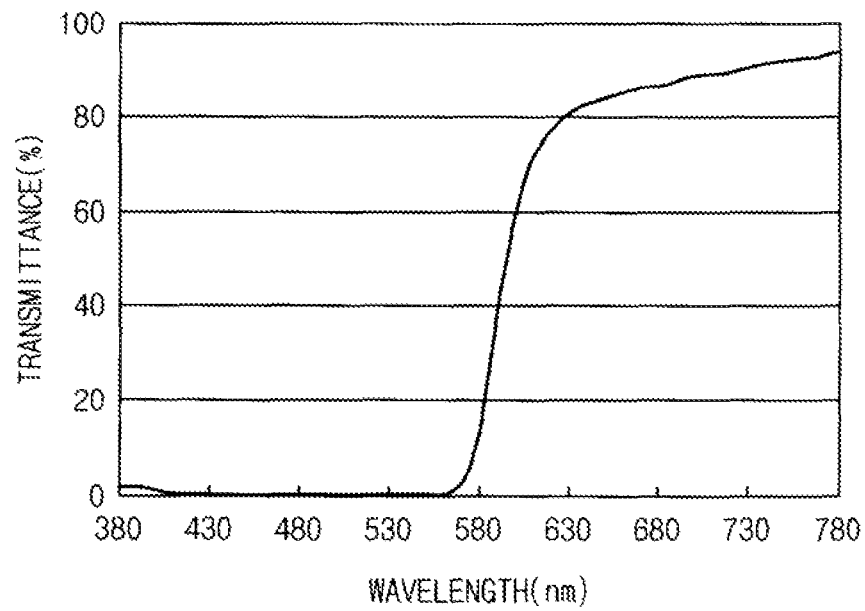
FIG. 3A is a graph illustrating the light transmittance as a function of wavelength of a color filter according to Example 1.

FIG. 3A is a graph illustrating the light transmittance as a function of wavelength of a color filter according to Example 1.

The color filter according to Example 1 was prepared to include a first coloring agent represented by Chemical Formula 1, wherein M represents aluminum, and $R_1$, $R_2$, $R_3$ and $R_4$ each independently represent an ethyl group, a third coloring agent represented by Chemical Formula 5, and a fourth coloring agent represented by Chemical Formula 9. Contents of the first coloring agent, the third coloring agent and the fourth coloring agent were respectively about 45% to about 55% by weight, about 35% to about 45% by weight, about 5% to about 15% by weight, based on a total weight of the first coloring agent, the third coloring agent and the fourth coloring agent combined. The light transmittance of the color filter was measured by using a light source that included a blue light emitting diode containing InGaN and a yellow fluorescent material. Light generated by the blue light emitting diode had wavelengths of about 400 nm to about 500 nm. The yellow fluorescent material included a nitride. Referring to FIG. 3A, the light transmittance of the color filter was about 0% in a wavelength range of about 420 nm to about 530 nm, which means that the light absorbing ratio of the color filter is about 100% in a wavelength range of about 420 nm to about 530 nm. Therefore, the color filter has a maximum light transmittance in a wavelength range of about 580 nm to about 750 nm. Thus, the color filter has a color reproducibility optimized for a red color filter.

Figure 3B:
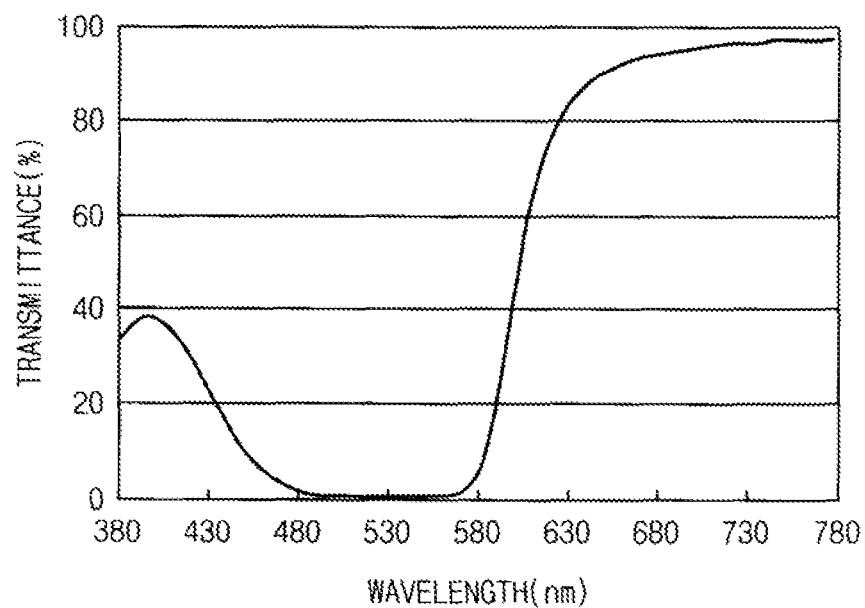
FIG. 3B is a graph illustrating the light transmittance as a function of wavelength of a color filter according to Comparative Example 1.

FIG. 3B is a graph illustrating the light transmittance as a function of wavelength of a color filter according to Comparative Example 1.

The color filter according to Comparative Example 1 was prepared to include a compound represented by Chemical formula 5, a compound represented by Chemical formula 3, and a compound represented by Chemical formula 9. Contents of the compounds represented by Chemical Formula 5, 3 and 9 were respectively about 45% to about 55% by weight, about 35% to about 45% by weight, and about 5% to about 15% by weight, based on a total weight of the combined compounds. The light transmittance of the color filter was measured by using a light source that included a blue light emitting diode containing InGaN and a yellow fluorescent material. Light generated by the blue light emitting diode had wavelengths of about 400 nm to about 500 nm. The yellow fluorescent material included a nitride compound.

Referring to FIG. 3B, the light transmittance of the color filter according to Comparative Example 1 was about 5% to about 40% in a wavelength range of about 420 nm to about 530 nm. Therefore, even if the color filter may be used for a red color filter having a maximum light transmittance in a wavelength range of about 580 nm to about 750 nm, the color reproducibility of the color filter may be reduced because light having a wavelength less than about 480 nm partially passes through the color filter.

According to the above, the color filter according to Example 1 of the includes the first coloring agent capable of minimizing a transmittance of light in a wavelength range of about 420 nm to about 470 nm, thereby preventing deterioration of the color reproducibility of a red color filter.

Figure 4A:
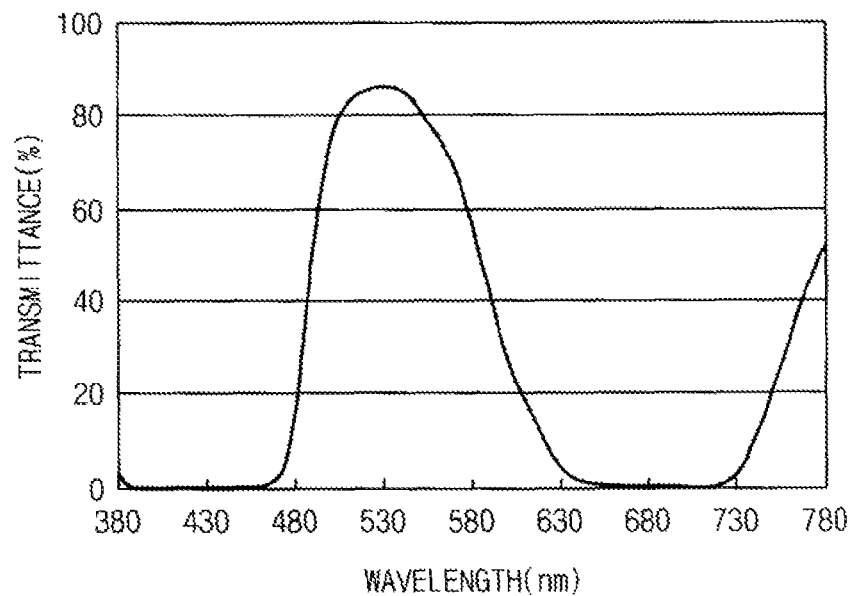
FIG. 4A is a graph illustrating the light transmittance as a function of wavelength of a color filter according to Example 2.

FIG. 4A is a graph illustrating the light transmittance as a function of wavelength of a color filter according to Example 2.

The color filter according to Example 2 was prepared to include a second coloring agent represented by Chemical formula 2, and a fourth coloring agent represented by Chemical formula 9. Contents of the second coloring agent and the fourth coloring agent were respectively about 55% to about 65% by weight, and about 35% to about 45% by weight, based on a total weight of the second coloring agent and the fourth coloring agent combined. The light source used for measuring the light transmittance of the color filter according to Example 2 is substantially the same as the light source used for measuring the light transmittance of the color filter of Example 1.

Referring to FIG. 4A, the light transmittance of the color filter was about 0% in a wavelength range of about 390 nm to about 470 nm, which means that the light absorbing ratio of the color filter is about 100% in a wavelength range of about 390 nm to about 470 nm. The color filter has a maximum light transmittance in a wavelength range of about 500 nm to about 550 nm. Thus, the color filter has a color reproducibility that is optimized for a red color filter.

Figure 4B:
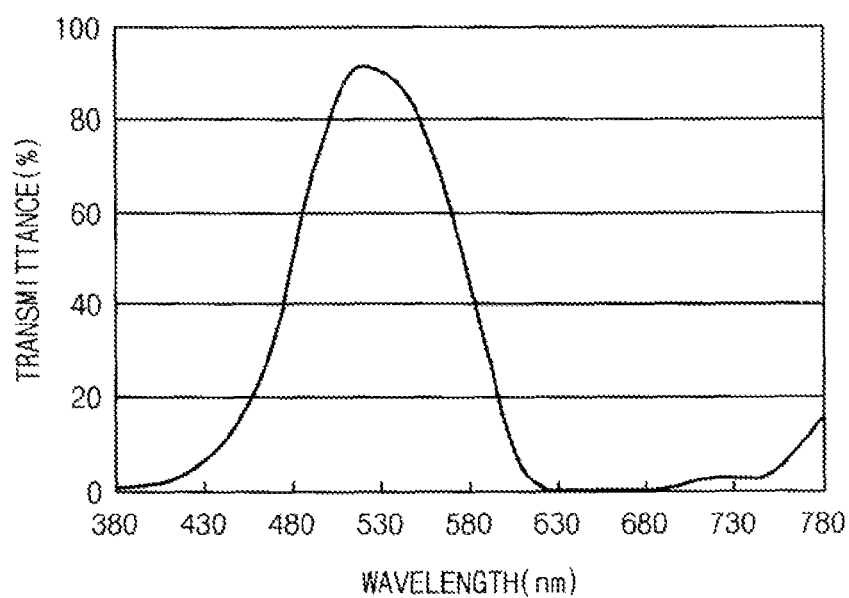
FIG. 4B is a graph illustrating a light transmittance of a color filter according to Comparative Example 2.

FIG. 4B is a graph illustrating the light transmittance as a function of wavelength of a color filter according to Comparative Example 2.

The color filter according to Comparative Example 2 was prepared to include a compound represented by Chemical formula 9, and a compound represented by Chemical formula 2. Contents of the compound represented by Chemical Formulas 9 and 2 were respectively about 55% to about 65% by weight, and about 35% to about 45% by weight, based on a total weight of the combined compounds.

Referring to FIG. 4B, the light transmittance of the color filter according to Comparative Example 2 to light having wavelengths less than about 480 nm is about 5% to about 40%. Therefore, even if the color filter may be used for a green color filter having a maximum light transmittance in a wavelength range of about 500 nm to about 550 nm, a color reproducibility of the color filter may be reduced because light having a wavelength less than about 480 nm partially passes through the color filter.

According to the above, the color filter according to Example 2 includes the second coloring agent capable of minimizing a transmittance of light in a wavelength range of about 420 nm to about 470 nm, thereby preventing deterioration of a color reproducibility of a green color filter.

According to example embodiments, when the display device employs a light emitting unit emitting a white light converted from a blue light by a light converting part, a color filter prevents transmittance of undesired light, thereby improving a color reproducibility of the display device.

Although exemplary embodiments have been described, it is understood that the present invention should not be limited to these exemplary embodiments but various changes and modifications can be made by one ordinary skilled in the art within the spirit and scope of the present invention as disclosed herein and as hereinafter claimed.

What is claimed is:
1. A display device comprising:
a light emitting unit including a light source and a light-converting part, the light source generating a blue light, the light-converting part converting a portion of the blue light into red light, another portion of the blue light into green light, and emitting a mixture of a remaining blue light, the red light and the green light from the light-converting party to an exterior of the light emitting unit to be perceived as a white light by an observer, and the remaining blue light having a wavelength in the range of 420 nm to 470 nm; and
a display panel including a first substrate, a second substrate and a liquid crystal between the first and second substrates, the display panel receiving the white light including the remaining blue light, at least one of the first and second substrate including a first color filter and a second color filter, the first color filter including a first coloring agent that has a maximum light transmittance in a first wavelength range of about 580 nm to about 750 nm and absorbs about 95% to about 100% of the remaining blue light having wavelengths of about 420 nm to about 470 nm, and the second color filter including a second coloring agent that has a maximum light transmittance in a second wavelength range of about 500 nm to about 550 nm and absorbs about 95% to 100% of the remaining blue light having wavelengths of about 420 nm to about 470 nm.

2. The display device of claim 1, wherein the first coloring agent includes a compound represented by the following Chemical Formula 1, wherein $R_1$, $R_2$, $R_3$ and $R_4$ independently represent a hydrogen atom, a hydroxyl group, an alkyl group having 1 to 30 carbon atoms, an alkenyl group having 2 to 30 carbon atoms, an oxyalkyl group having 1 to 30 carbon atoms, a cycloalkyl group having 3 to 30 carbon atoms, an aryl group having 6 to 30 carbon atoms, or a derivative or a polymer thereof, and M represents chromium (Cr), aluminum (Al), gallium (Ga) or indium (In)

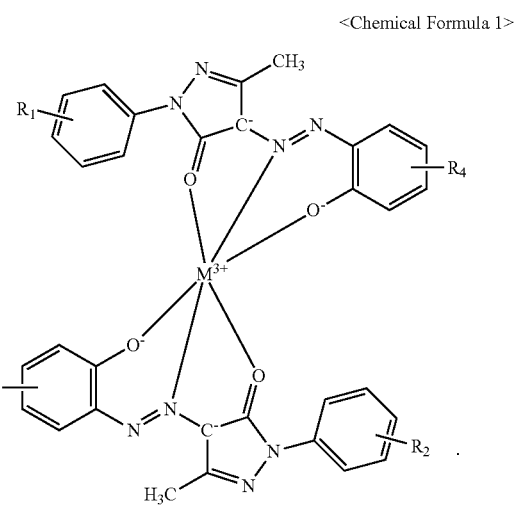

<Chemical Formula 1>

3. The display device of claim 2, wherein the display panel further includes a second color filter including a second coloring agent that absorbs about 95% to about 100% of light having wavelengths of about 420 nm to about 470 nm in the white light, the second coloring agent including a compound represented by the following Chemical Formula 2, wherein $R_5$ and $R_6$ independently represent a hydrogen atom, a hydroxyl group, an alkyl group having 1 to 30 carbon atoms, an alkenyl group having 2 to 30 carbon atoms, an oxyalkyl group having 1 to 30 carbon atoms, a cycloalkyl group having 3 to 30 carbon atoms of 3 to 30, an aryl group having 6 to 30 carbon atoms, or a derivative or a polymer thereof <Chemical Formula 2>

4. The display device of claim 1, wherein the first color filter includes at least one selected from the group consisting of compounds represented by the following Chemical Formulas 3, 4 and 5

<Chemical Formula 3>

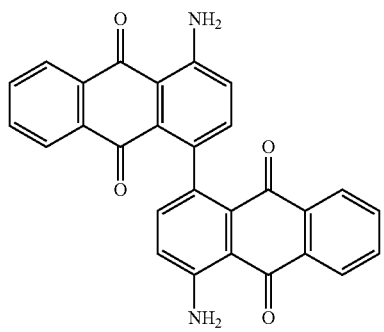

<Chemical Formula 4>

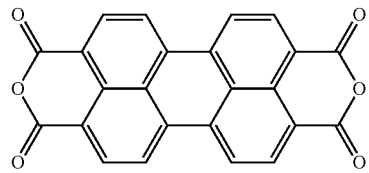

<Chemical Formula 5>

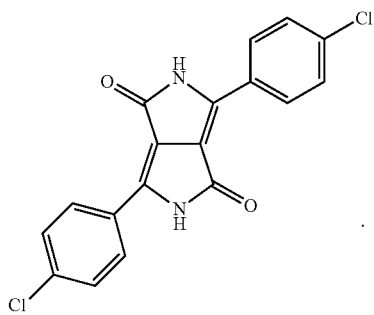

5. The display device of claim 4, wherein the first color filter further includes at least one selected from the group consisting of compounds represented by the following Chemical Formulas 6, 7, 8, 9, 10 and 11

<Chemical Formula 6>

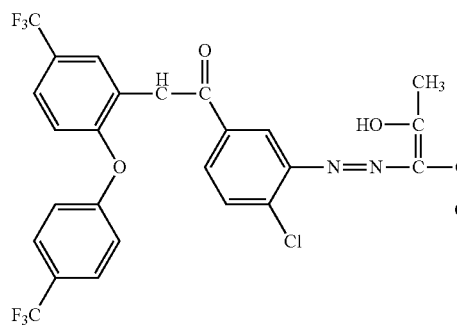

<Chemical Formula 7>

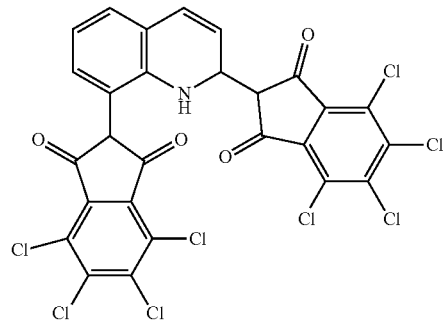

<Chemical Formula 8>

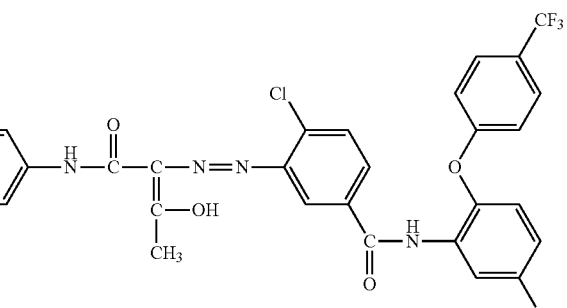

<Chemical Formula 9>

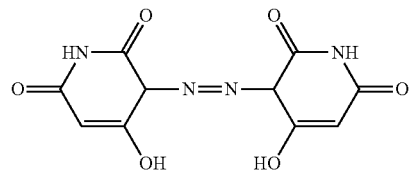

<Chemical Formula 10>

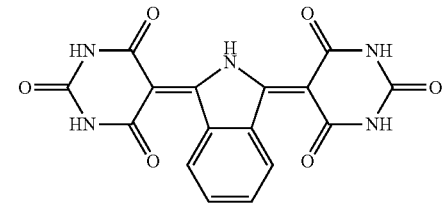

<Chemical Formula 11>

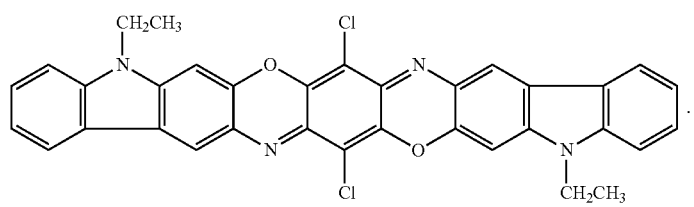

6. The display device of claim 1, wherein the first coloring agent includes a compound represented by the following Chemical Formula 2, wherein $R_5$ and $R_6$ independently represent a hydrogen atom, a hydroxyl group, an alkyl group having 1 to 30 carbon atoms, an alkenyl group having 2 to 30 carbon atoms, an oxyalkyl group having 1 to 30 carbon atoms, a cycloalkyl group having 3 to 30 carbon atoms, an aryl group having 6 to 30 carbon atoms, or a derivative or a polymer thereof <Chemical Formula 2>

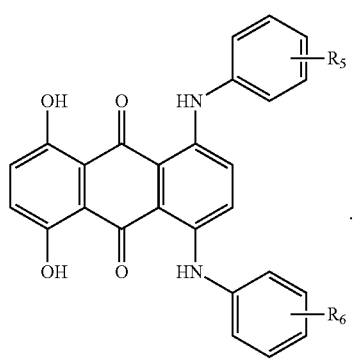

7. The display device of claim 1, wherein the first color filter includes at least one selected from the group consisting of compounds represented by the following Chemical Formulas 12, 13 and 14

<Chemical Formula 12>

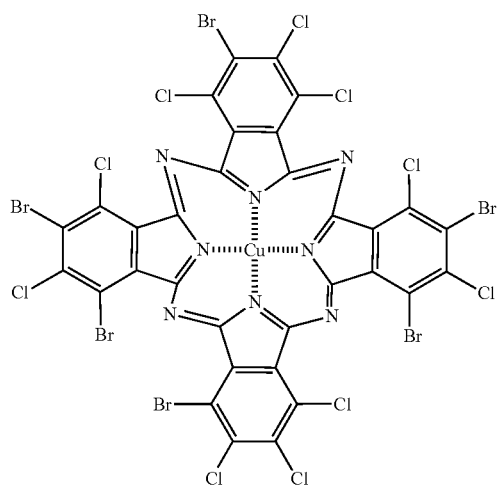

<Chemical Formula 13>

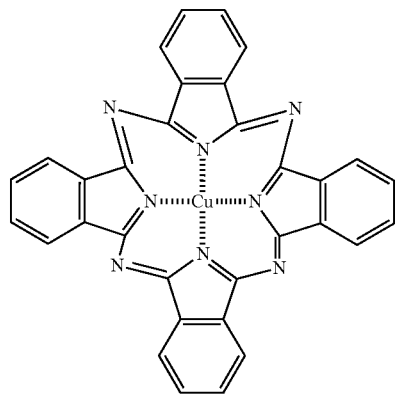

<Chemical Formula 14>

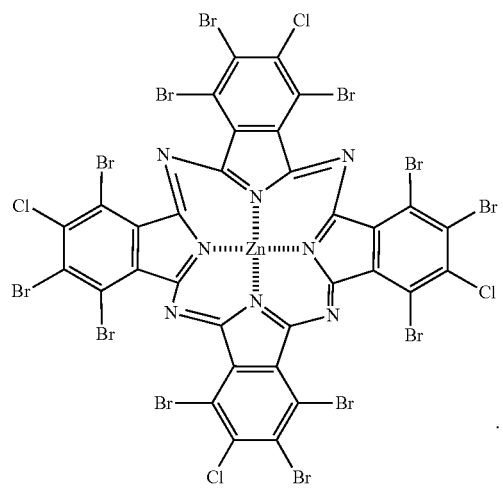

8. The display device of claim 7, wherein the first color filter further includes at least one selected from the group consisting of compounds represented by the following Chemical Formulas 6, 7, 8, 9, 10 and 11

<Chemical Formula 6>

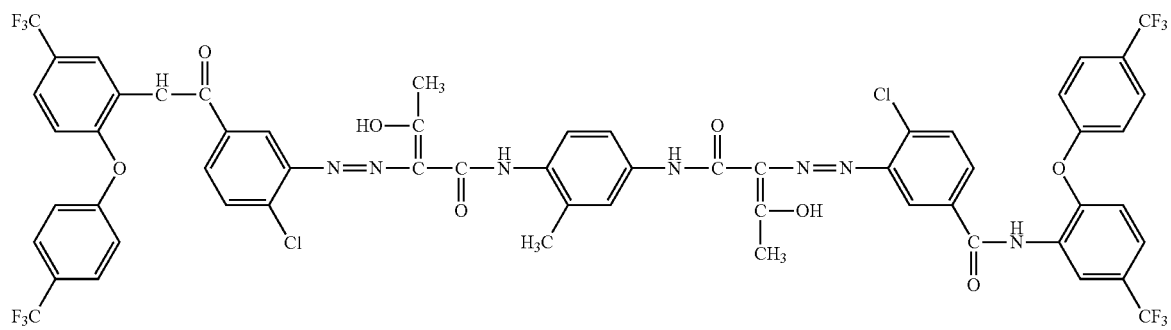

-continued
<Chemical Formula 7>
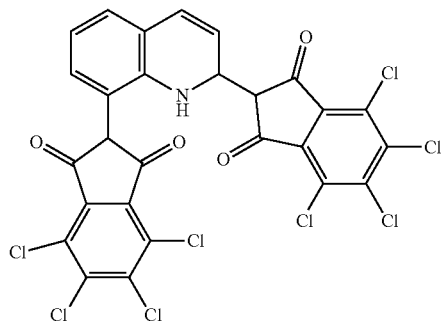
<Chemical Formula 8>
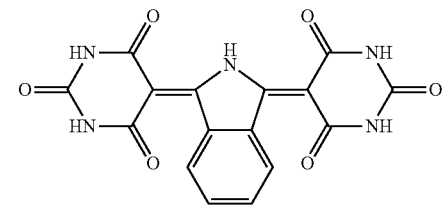
<Chemical Formula 9>
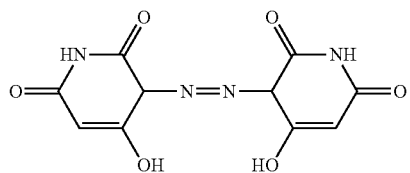
<Chemical Formula 10>
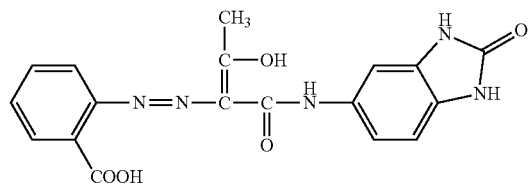
<Chemical Formula 11>
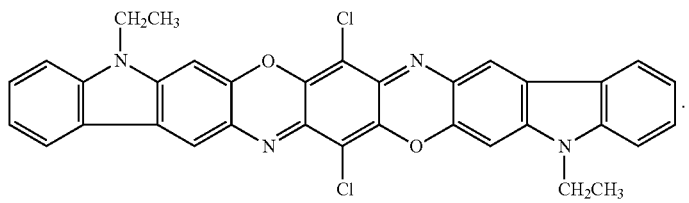
9. The display device of claim 1, wherein the light source includes gallium nitride (GaN) and indium gallium nitride (InGaN), and the light-converting part includes a fluorescent material.
* * * * *